United States Patent [19]
Bolanos et al.

[11] Patent Number: 5,912,024
[45] Date of Patent: *Jun. 15, 1999

[54] SPROUTLESS PRE-PACKAGED MOLDING FOR COMPONENT ENCAPSULATION

[75] Inventors: Mario A. Bolanos, Plano; Jeremias L. Libres, Dallas; George A. Bednarz, Plano, all of Tex.; Tay LiangChee, Singapore, Singapore; Julius Lim, Johor, Malaysia; Ireneus J. T. M. Pas, Rozendaal, Netherlands

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/643,661
[22] Filed: May 6, 1996

Related U.S. Application Data

[62] Division of application No. 08/434,336, May 2, 1995.
[51] Int. Cl.[6] .................................................. B29C 45/02
[52] U.S. Cl. ................ 425/116; 264/272.17; 264/328.5; 425/544; 425/588
[58] Field of Search ............................... 425/89, 98, 116, 425/121, 129.1, 546, 588, DIG. 228; 264/272.17, 338, 328.5

[56] References Cited

U.S. PATENT DOCUMENTS

| | | | |
|---|---|---|---|
| H1654 | 6/1997 | Rounds | 425/89 |
| 4,983,110 | 1/1991 | Yoshida et al. | 425/116 |
| 5,043,199 | 8/1991 | Kubota et al. | 264/328.5 |
| 5,071,334 | 12/1991 | Obara | 425/116 |
| 5,098,626 | 3/1992 | Pas | 264/328.5 |
| 5,108,278 | 4/1992 | Tsutsumi et al. | 425/116 |
| 5,302,101 | 4/1994 | Nishimura | 425/116 |
| 5,431,854 | 7/1995 | Pas | 425/DIG. 228 |
| 5,435,953 | 7/1995 | Osada et al. | 264/544 |

FOREIGN PATENT DOCUMENTS 2-260438  10/1990  Japan .

*Primary Examiner*—Robert Davis
*Attorney, Agent, or Firm*—Mark E. Courtney; W. James Brady III; Richard L. Donaldson

[57] ABSTRACT

A method and apparatus for encapsulating an integrated circuit die and leadframe assembly. A prepackaged sproutless mold compound insert 71 is placed in a rectangular receptacle 91 in a bottom mold chase 81. The receptacle is coupled to a plurality of die cavities 85 by runners 87. Leadframe strip assemblies containing leadframes, integrated circuit dies, and bond wires coupling the leadframes and dies are placed over the bottom mold chase 81 such that the integrated circuit dies are each centered over a bottom mold die cavity 85. A top mold chase 90 is placed over the bottom mold chase 81 and the mold compound package 71. The top mold chase 90 has die cavities 95 corresponding to those in the bottom mold chase 81. The mold compound insert 71 is preferably packaged in a plastic film 75 which has heat sealed edges 77. The mold compound is forced through the package 75 and heat seals 77 during the molding process by the pressure applied by a rectangular plunger 101. The sproutless mold compound insert is packaged so that the mold compound will exit the packaging only where runners intersect the receptacle. The sproutless mold compound insert requires no alignment or cutting tools within the mold station. The plunger is applied using variable speed and pressure to control the rate the mold compound fills the cavities in the top and bottom mold chases, thereby avoiding voids in the completed packages and minimizing wire sweep of the bond wires of the integrated circuit assemblies.

5 Claims, 5 Drawing Sheets

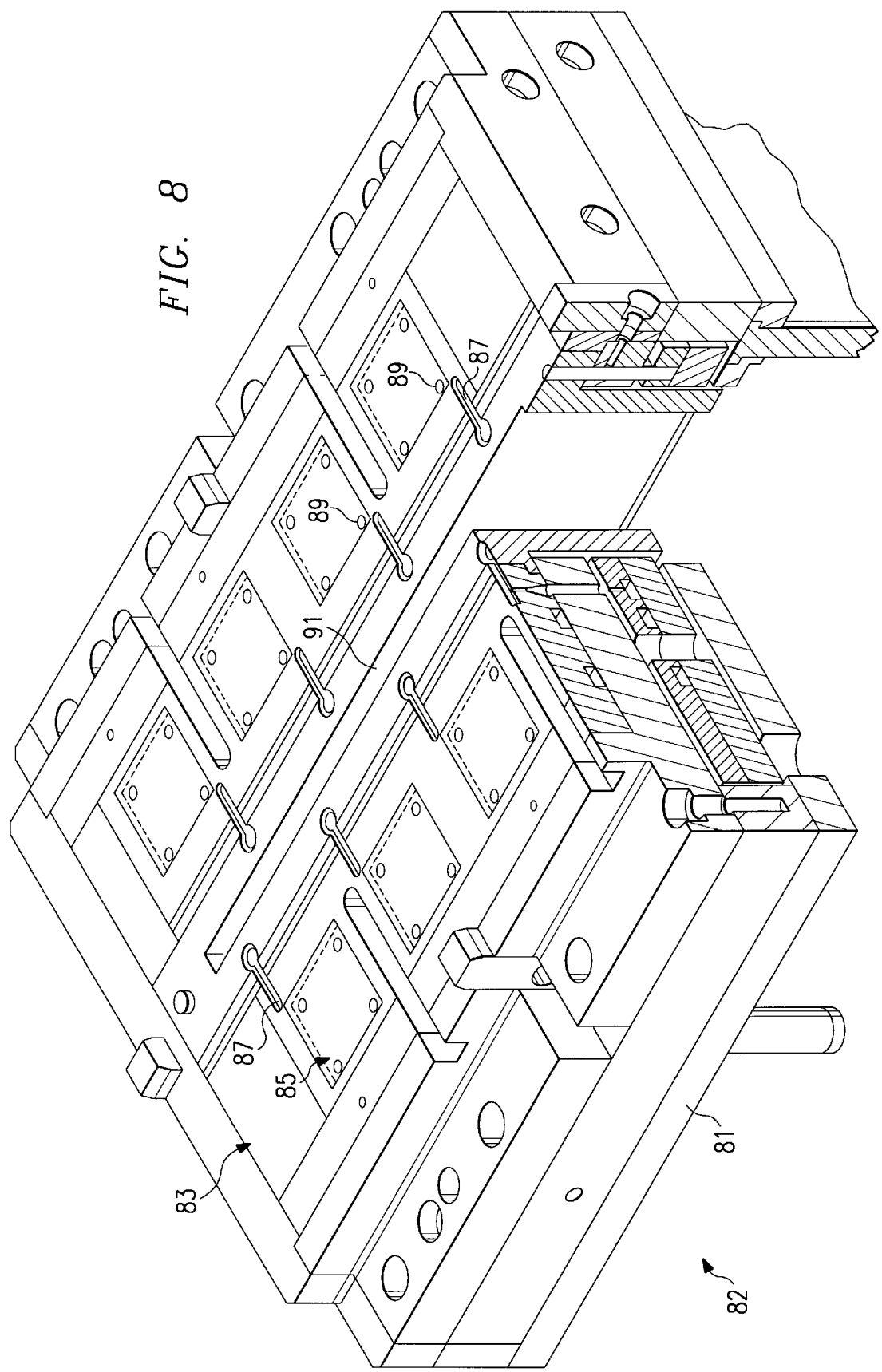

SPROUTLESS PRE-PACKAGED MOLDING FOR COMPONENT ENCAPSULATION

This is a Divisional of application Ser. No. 08/434,336, filed May 2, 1995.

FIELD OF THE INVENTION

This invention relates generally to the field of integrated circuits, and more particularly to the encapsulation packaging of integrated circuits using transfer molding techniques.

BACKGROUND OF THE INVENTION

In producing integrated circuits, it is desirable to provide packaged integrated circuits having plastic or resin packages which encapsulate the die and a portion of the lead frame and leads. These packages have been produced a variety of ways, a few of which will be described here.

Conventional molding techniques take advantage of the physical characteristics of the mold compounds. For integrated circuit package molding applications, these compounds are typically thermoset compounds. These compounds consist of an epoxy novolac resin or similar material combined with a filler, such as alumina, and other materials to make the compound suitable for molding, such as accelerators, curing agents, fillers, and mold release agents.

The transfer molding process as known in the prior art takes advantage of the viscosity characteristics of the molding compound to fill cavity molds containing the die and leadframe assemblies with the mold compound, which then cures around the die and leadframe assemblies to form a hermetic package which is relatively inexpensive and durable, and a good protective package for the integrated circuit.

FIG. 1 depicts the viscosity characteristic curve of a typical mold compound. The Y axis depicts the viscosity of the compound. The X axis represents the time elapsed from a starting point where heat is applied. The mold compound transitions from a high viscosity or hard state to a state where it has very low viscosity after an initial time lapse. The low viscosity stage lasts only a limited time period, typically 20 to 30 seconds, then the compound becomes higher in viscosity and begins to set, or cure. For the entire period the mold compound is heated. The mold compound is thermoset material, so that after being heated for a time period longer than the low viscosity time period it will cure or set.

Transfer molding operations have three stages which correspond to the three phases of viscosity shown in FIG. 1. First there is a preheat stage required to move the mold compound from its hard initial state to the low viscosity state. Second is a transfer stage, where the compound is low in viscosity and easily transported and directed into cavities and runners. This transfer process should be rapid and be completed before the mold compound begins to set. Finally there is a cure stage that occurs following the transfer stage.

FIG. 2 depicts a conventional single plunger transfer mold press 11. The press consists of a plunger or ram 13 that is operated under hydraulic pressure, a top platen 15, a top mold chase 17, a bottom platen 19, and a bottom mold chase 21. A fixed head 23 supports the plunger and a movable head 18 support the top platen, and allows the top platen to be removed for loading and unloading the mold from the top. Mold heaters 25 provide heat to the mold in both the top and bottom platens. An automated mold controller, although not shown, is usually coupled to the press. The top and bottom platens are steel and receive the stresses of the pressing operation, both are heated to provide the temperature needed to perform the transfer molding operation.

FIG. 3 depicts a typical bottom mold chase. In FIG. 3, a top view of bottom mold chase 21 is shown. There are six primary runners 31, each will support a pair of leadframe strips holding wire bonded dies and lead assemblies over each cavity 33. The cavities are formed along the runners 31, which are cylindrical shaped paths that extend from the mold pot 32 and into the rows of cavities. Each cavity is coupled to the runners by a secondary runner 35 which ends in a gate 37, a small opening that lets the mold compound into the cavity. The size and shape of the gate is critical to the speed and control of the transfer and filling stages of the molding process.

FIG. 4 is a detailed drawing of a single runner 31 with a single die cavity 33 shown. The secondary runner 35 is shown coupling the primary runner to the gate 37 and to the die cavity 33. Runner 31 is coupled to the pot 32.

FIG. 5 depicts a cross section BB from FIG. 4. This cross section is taken across the primary runner 31 and along secondary runner 35, and depicts the sloped shape of secondary runner 35 up to the gate 37. The lead frame 51 of a typical bonded part is shown over the bottom mold chase cavity and under the top mold chase cavity 34. Die 53 is shown with the bond wires 55 coupling it to leadframe 51.

The operation of the conventional single pot transfer mold will now be described with reference to FIGS. 2–5. To begin a new molding operation, the mold press is opened and the top and bottom mold chases 17 and 21 are separated. The leadframe and die assemblies are loaded into the bottom mold chases. The mold compound is preheated using an RIF heater or other heater before being placed into the heated mold.

The top and bottom platens are closed, bringing the top and bottom mold chases together. The top and bottom mold chases 17 and 21 are patterned to define a cavity around each die, with the lead frames extending outside the cavity and a space formed around each die. Several leadframe strips each having a row of dies 53 which are bonded to their respective lead frames 51 are placed over the cavities 33 in the bottom mold chase 21. A pellet of resin or similar material mold compound is placed in the mold pot within the top mold chase 17. After an initial heating stage to put the mold compound into its low viscosity state, the plunger or ram 13 is used to begin the transfer phase of the operation. The plunger 13 is brought down through the top mold chase 17 onto the mold compound pellet at a predetermined rate, forcing the mold compound into the primary runners 31. As the runners fill with mold compound the compound will begin filling the secondary runners 35, entering the gates 37 beneath the leadframe and die assemblies 51 and filling the cavities 33.

At the end of the transfer stage the mold compound should fill each cavity 33, preferably at the same time and before the mold compound begins to cure. The rate of the downward force brought by the plunger 13 is varied during the transfer phase to help control the transfer process. Experimental use of the press 11 with a particular mold and compound combination will provide the best combination of pressure and transfer speed which can then be programmed into the automatic press controls to uniformly repeat the process.

After the transfer stage, the packaged parts are cured. Curing the molded parts typically takes 1 to 3 minutes of sitting in the heated mold without disturbance. The compound cure is fairly rapid and may be enhanced by adding curing agents to the compound. At the end of the curing cycle the press is opened and the molded parts and the mold compound sprue or flash in the runners and pot are ejected. This is done by having ejection pins extending through the bottom mold chase 21 and bottom platen 19 push upward under pressure at the same instant, popping the molded parts and sprue out of the bottom mold chase 21. The packaged parts are then removed to other areas where they are separated and trim and form operations performed on the parts.

There are several critical requirements that are to be met in a commercially successful package molding operation. The cavities should be completely and uniformly filled. Using the single plunger mold of FIGS. 2–5 the cavity fill stage is difficult to perform uniformly across such a large mold using the single pot and the long primary runners to transport the mold compound. A problem commonly observed in a single plunger single pot mold operation using a mold such as shown in FIG. 2 is an unacceptable void rate. Voids are areas within the mold cavity that are not filled with compound. These can be areas where the compound fails to flow or where air or other materials are trapped and cause hollow spaces in the packaged part. Voids can be produced if the transfer rate of the mold compound is too slow during the molding process or if air or moisture is trapped in one or more the cavities during the transfer stage.

A second critical requirement is that the wire sweep defect rate be minimized below an acceptable level. Wire sweep occurs as the mold compound enters the cavity through the gates. The mold compound is dense and pulls at the fine wires that couple the bond pads of the die to the leads of the lead frame. These wires will bend under the pressure due to the flow of mold compound. As an example, suppose that in a typical lead frame and die assembly, an average wire sweep of less than 6% is specified. A straight line from the lead frame lead to the bond pad has a sweep of 0%. So if after assembly and mold any wires on a packaged unit are found to have more than 6% sweep, the unit is out of specification, and is considered to be a bad unit. Wire sweep is specified as a maximum allowable parameter and is a big concern in production of integrated circuits, because if the bond wires are moved too much, a wire short between two or more adjacent bond wires often occurs. Alternatively, bond wires sometimes break away. Either condition results in a faulty unit.

Although the wire sweep defect rate which is observed in the single plunger molding presses is adequate for producing low to moderate pin count DIP and flat quad packaged devices, as the device pin counts continue to increase and lead frames become finer in lead to lead pitch, the wire sweep parameter becomes increasingly critical. While it is possible to build 200 pin flat quad devices using these techniques, as the pin count goes towards 400 pins the prior art transfer molding presses using a single mold pot will no longer be economically suitable, due to the low yield and high wire sweep defect rates.

A further disadvantage with a single plunger mold and pellet compound arrangement is that the performance in the two critical areas are inversely dependent on each other. That is, in attempting to perfect the molding process using a single plunger mold, it has been observed that steps taken to reduce wire sweep defects typically increase the void rate, and vice versa. In other words, if the wire sweep defect rate is lowered, the void rate tends to increase. The wire sweep rate can be lowered, for example, by slowing the transfer rate of the mold compound into the cavities. However, doing this tends to increase the void rate. Voids can be reduced by increasing the flow rate into the cavities, but this will tend to increase the wire sweep defect rate.

It has been further observed that the wire sweep and void problems tend to be more severe as the number of cavities and the distance of runners increases. Nonuniform fill can occur along a lengthy runner having many cavities. The cavity closest to the pot will have a faster fill rate than the others. The cavity farthest from the pot will tend to fill at the end of the transfer period, and the rate will be lower because much of the compound has been diverted to other cavities and because the compound is starting to harden. As a result, difficult and time consuming fine tuning of each mold press is required to establish an operation mode which will fill all of the cavities at an acceptable rate, during the low viscosity period, without increasing wire sweep defects to an unacceptable level, particularly for the near and far cavities.

Further, the use of the thermoset molding compound results in a process where the sprue, flash or waste that is left in the pot, the runners and between the devices themselves cannot be reused. Thermoset materials can only be used once in a molding operation, so the excess material must be discarded. Thus the sprue and waste left in the long runners and in the mold pot cannot be recycled.

Also, the conventional molding compound acts as a strong abrasive. During molding, the mold compound is forced out of the mold pot and into the primary runners. The abrasive nature of the mold compound results in rapid wear of the mold pot and the runners, and the plunger or ram itself. This results in expensive rework or replacement of the mold chases on a frequent basis.

An alternative approach for reducing the problems known to the single plunger molding presses of the prior art is to construct a multipellet, multiplunger mold station to replace the single plunger system. A portion of the bottom mold chase of a typical prior art multiplunger mold is shown in FIG. 6. Mold chase 61 has several die cavities 63, grouped in pairs. Runners 67 couple each pair of die cavities to a mold pot 69. Gates 65 enable the mold compound to be transferred into and fill the cavities.

In operation, each of the mold pots 69 receives a so called "mini-pellet" of mold compound. The press is a more complex press than that shown in FIG. 2, and has a plunger for each of the mold pots. The plungers may operate from the top or from underneath the mold. Each mold pot 69 and the short runners 67 act exactly as the single plunger mold of FIG. 2 in operation. The individual plungers are used to start the transfer process, the cavities fill with mold compound as the plunger is pushed into the mold pot, and the transfer phase is completed in a few seconds.

The multiplunger mold process has some advantages over the single pot molding process. The use of the smaller pellets and the shorter runs eliminate the long runners and nonuniform fill times associated with a single plunger press. The pellets used are smaller and therefore do not require preheating, as the mold platens can provide sufficient heat to transition the mini-pellets into the low viscosity state. The wire sweep defect rate can be lowered by providing exact control of the plunger or ram insertion rate, so that the fill is done at a speed which prevents voids while minimizing wire sweep problems. An automated multiplunger press can vary the operation of the plungers during the transfer stage to obtain optimal results.

The nonuniform fill and wire sweep problems associated with the cavities nearest and farthest from the single center pot of the single plunger mold presses are eliminated. Mold compound waste is reduced by the shorter runners.

The disadvantages of the multiplunger molding process are primarily that it requires the use of the mini-pellets. The mini-pellet form of the molding compound is far more expensive per kilogram than the single large pellets used by the single transfer mold. Also, the multiplunger molding station is extremely expensive to manufacture, operate and maintain. The automation of a press with so many plungers is more complex and expensive than the single mold press.

In addition to the added costs, the need for many plungers results in a molding station that has a lower parts per hour throughput than for a conventional single pot mold press. Also the multiple plunger molding system requires complex control and loading and unloading mechanisms. The result is that each station has lower overall throughput than a single plunger mold station, although tighter process control can be achieved. Because the throughput is lowered, additional stations are needed to maintain the same relative level of productivity. High productivity is required to keep the per unit costs low. The need for additional expensive and complex molding stations increases the cost disadvantages for the multiplunger molding systems.

An alternative is a multigang, multipot mold system. This arrangement borrows the simplicity of the single pot mold and adds the multiple pellet idea of the multi-plunger mold by having multiple plungers ganged together and using multiple pots in the mold chase, each feeding two to four cavities with mold compound. By reducing the transfer distance it is hoped wire sweep and void rate problems can be improved. However, tight process control is not available because the plungers all travel at the same speed and pressure unless an external controller is installed. So this alternative has the disadvantages of requiring the mini-pellets of mold compound, while not providing the highly automated process control of a multi-plunger mold system.

Both single plunger and multiplunger mold presses have other disadvantages that are common. The mold compound is an abrasive material. The mold pot and the primary runners receive an abrasive force each time the press is operated. These areas wear quickly and the expensive mold chases must be replaced periodically as a result.

Also, both processes require pelletized mold compound. This material is fairly difficult to produce in the large form, and even more expensive to produce in the minipellet form. The compound is extruded into a rod, which is powdered, and the powder is then pelletized. This is an expensive and complex manufacturing process.

Both pellets and mini-pellets are subject to contamination by moisture and air. It is necessary to perform the molding process under pressure to eliminate trapped air and prevent the formation of voids. Moisture can become trapped in either form of pellet. Moisture contamination of the molding compound can result in additional voids and scrapped devices. Moisture contamination also contributes to package cracking during cure and afterwards to early failure of devices.

U.S. Pat. No. 5,098,626, issued Mar. 24, 1992, and entitled "Method for Packing a Measured Quantity of Thermosetting Resin And Operating a Mold for Encapsulating a Component", and herein incorporated by reference, provides another alternative wherein the mold compound is packaged in individually sealed units. These units each contain mold compound in a quantity needed for a single cavity or pair of cavities for integrated circuit packages. Each of these units is a bag or tube containing mold compound and ending in a bulge or sprout. During molding the bulge or sprout is placed at the end of a runner which feeds a cavity. The sprout is cut and the mold compound is pressed out of the bag into the cavity by individual, multiple plungers.

The '626 patent approach is similar to a multiplunger mold system in that small quantities of mold compound, each of which are individually loaded, are provided. The patent provides a moisture and contamination free packaging system which can be used with an automated loading system. However, like the mini-pellets, many of these bags are required for each run. The abrasion problems are reduced, because the pots and plungers are protected by the packaging. Also, improved uniform fill and reduced wire sweep are possible. But the throughput problems and increased expense for each molding station remain, and the costs for each press are increased further by the added complexity. Also, the packaging of the mold compound in small quantities each in an individual package may lead to an expensive raw material for molding.

Further, the spouted bags of the '636 are fitted into the runner openings. The bags are supplied attached to a tape or spool for continuous feed loading. However, this particular feature of the sprouted bag containers means that the bags and the tape or spool must be custom designed for each particular mold, and if the mold design is changed, a different bag design must be used. Also, the complexity of loading a bag for each cavity or each pair of cavities adds to the precision and cost of the loading equipment used. Further, the molding equipment must include a cutter device for each cavity that cuts the sprout of the bag prior to the transfer stage of molding.

Accordingly, a need thus exists for a transfer molding system which eliminates the problems of the prior art transfer molding systems while retaining a high part throughput rate, low raw material costs, and which is simple to operate, maintain, and uses molding stations that are relatively inexpensive to build. The new system should be compatible with existing single pot transfer mold presses to allow a retrofitting of existing integrated circuit assembly lines. The system should reduce waste of mold compound and reduce the abrasive impact of the mold compound on the equipment used. The new molding system should provide uniform cavity fill and reduced wire sweep defect rates. The system should be general, such that different mold designs can be used with a common mold compound package.

SUMMARY OF THE INVENTION

A system for transfer molding the packages of integrated circuits using mold compound prepackaged in a sproutless protective package is provided. The mold compound is packaged in a thin packaging that is sealed at the edges, or is made as a seamless bag or tube. The packaging will protect the mold compound and contain it during normal handling and storage, but under the heat, pressure, or the combination of heat and pressure of particular molding processes the package will become penetrable and the mold compound can be expelled through it. The package is placed in a simple mold pot or receptacle, and when the packaged compound is compressed the compound emerges from the package only at places adjacent to the mold runners during the transfer molding process. The protective packaging ensures that the mold compound is free from moisture and air contamination and is easily produced, stored and shipped.

An improved mold design is used in combination with the packaged sproutless mold compound inserts. The mold chases include rectangular receptacles for receiving the packets of prepackaged mold compound. A plunger is provided for each of the receptacles. Each package cavity is preferably equidistant from the receptacle containing mold compound, providing improved uniformity of fill and allowing for complete fill of the cavities with reduced wire sweep as compared to the transfer molds of the prior art. The plunger is inserted and the mold compound is forced through the protective packaging into short runners coupling the mold receptacle to the cavities. The number of devices packaged per run is increased because the mold pots of the single or multiple plunger molds of the prior art are eliminated, providing additional area for die cavities.

The mold compound is placed inside the mold receptacle within the protective package, so that the equipment abrasion problems associated with conventional prior art transfer molding operations are reduced or eliminated. Since the runners are shortened, the amount of mold compound which is flash or sprue for each run is reduced, thus reducing waste and lowering production costs. The improved mold design is compatible with automated loading, molding and unloading systems for increased automation and improved throughput. The molding station requires only a few plungers and is inexpensive to build and maintain. Existing molding equipment may be retrofitted to use the new system. The mold compound package may be automatically loaded into the mold chases by using existing autoloading equipment. Since the mold compound will automatically be delivered to the runners regardless of the position of the sproutless mold compound insert, no alignment or precise loading equipment is required. Also, since the mold compound is pushed through the packaging, no cutters or opening tooling are required. The prepackaged sproutless mold compound system is easily combined with a process controller to achieve tight process control. The use of the sproutless pre-packaged mold system with a process controller results in a mold process with balanced cavity fill, reduced wire sweep and low void defect rates.

BRIEF DESCRIPTION OF THE DRAWINGS

FIG. 8 depicts a bottom mold and chase of the mold system of the invention;

Corresponding numerals are used for corresponding elements in the drawings, unless otherwise indicated in the text.

DETAILED DESCRIPTION OF PREFERRED EMBODIMENTS

Figure 1:
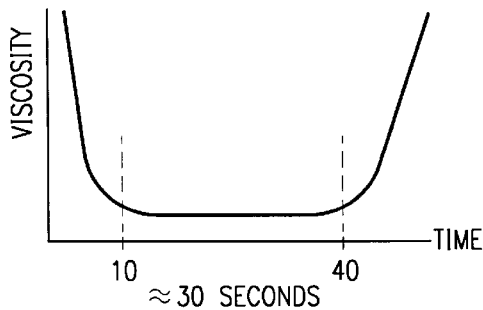
FIG. 1 depicts the viscosity characteristic curve for conventional mold compound.
Figure 4:
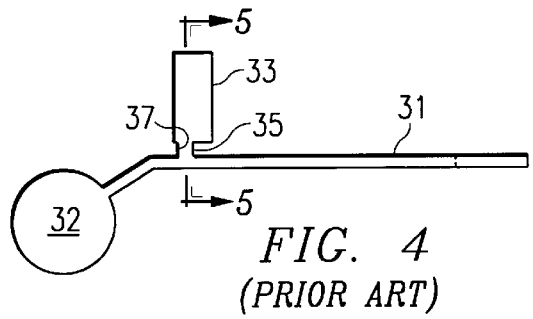
FIG. 4 depicts a section of the bottom mold chase of FIG. 3 in more detail.
Figure 2:
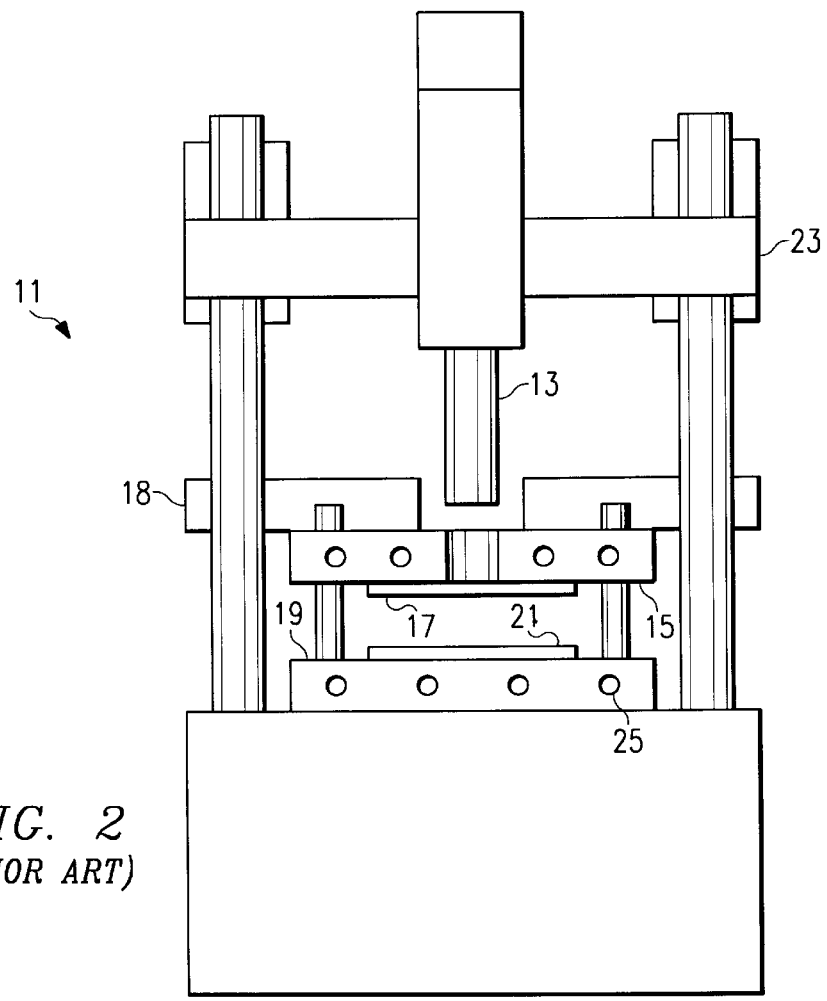
FIG. 2 depicts a conventional single plunger mold press.
Figure 3:
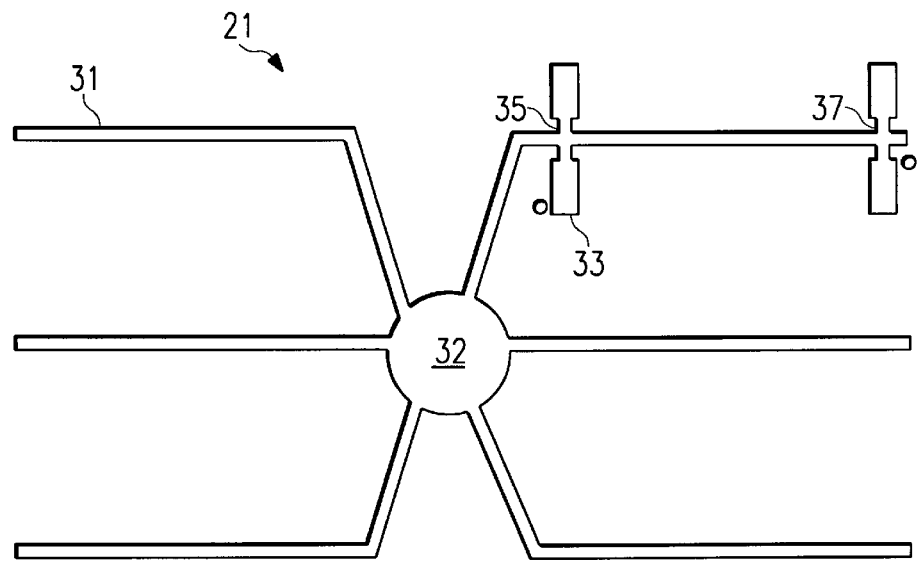
FIG. 3 depicts the bottom mold chase and runners of a mold used with the conventional mold press of FIG. 2.
Figure 5:
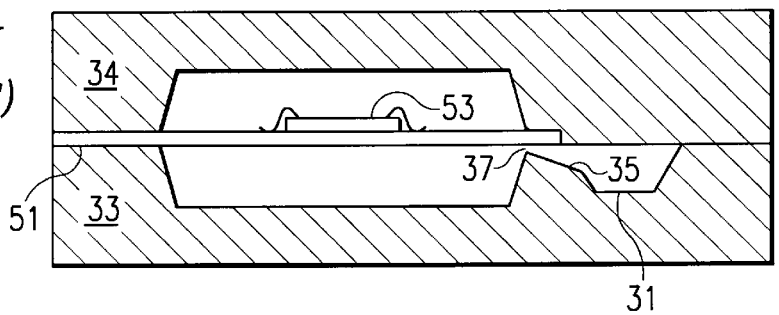
FIG. 5 depicts a cross section of the runner of the bottom mold chase shown in FIG. 4.
Figure 7:
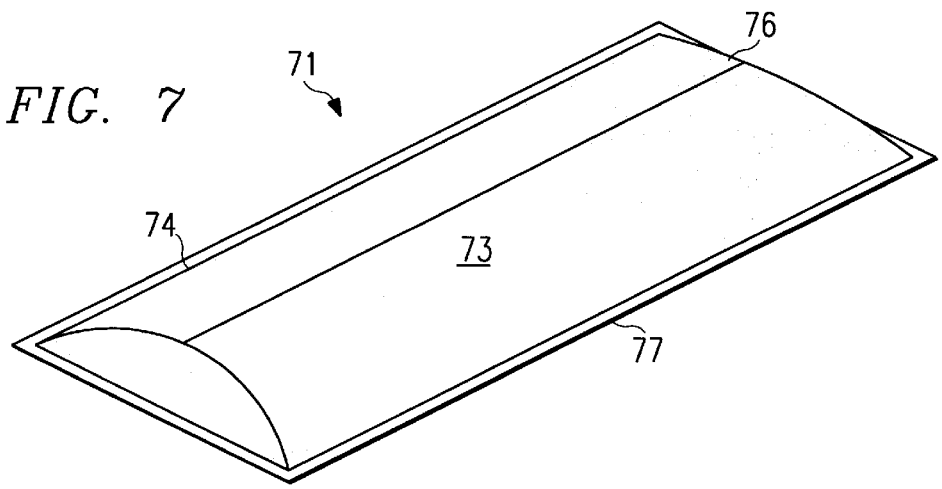
FIG. 7 depicts a sproutless mold compound package of the invention.
Figure 6:
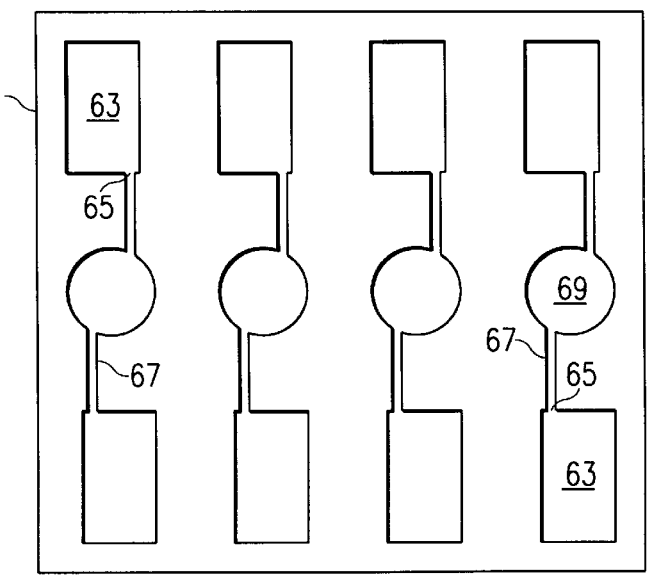
FIG. 6 depicts a bottom mold chase and runner of a multiplunger mold.

FIG. 7 depicts a prepackaged sproutless mold compound insert 71 in a first preferred embodiment of the mold compound of the invention. In a first embodiment, a prepackaged mold compound insert is composed of conventional resin or resin filler mold compound in a solid form. Alternative molding compounds may be used, such as liquids, epoxies, adhesives, resins in liquid form, powdered mold compound, as examples. The mold compound material may be made from powdered mold compound or from extruded mold compound directly, eliminating the need for the expensive pelletizing steps required for the pellets of the prior art mold compounds. The shape of the prepackaged mold compound is determined be the design of the mold being used, here a rectangular pillow-like shape is shown, but any other shape can be used and should be used to advantage with different mold designs.

The mold compound material 73 is preferably packaged in a pre-formed package 71. Ends 76 are sealed. Top 74 is wider than the mold compound 73 and provides a lip on either side of the mold compound 73. A corresponding bottom piece is likewise provided. Top and bottom pieces 74 and 75 are sealed together at the edges 77 and the top and bottom are also sealed at the ends 76. Ends 76 and edges 77 are seals that couple the bottom (not shown) to the top 74 using, for example, conventional heat sealing techniques for plastic packaging. Alternative sealing techniques such as ultrasonic seals, adhesives, and pressure seals or crimped seals can be used.

Alternatives to the package of FIG. 7 include tubes and bags of various shapes. For example, the shapes can include ovoid, circular, oval, and others may be imagined. The mold design and runner placement will determine the shape of the mold compound insert 71. The insert can be packaged such that precision placement of the insert into the mold is not necessary; the insert can be sized so that as the mold closes the insert falls into the proper place, providing a self aligning feature not available in the sprouted bags of the prior art. In contrast, the sprouted bags or packets of the prior art require that the runners and mold compound inserts be carefully aligned.

The sproutless mold compound package of FIG. 7 provides the advantages of making the mold compound impervious to contaminants such as water that could interfere with the molding process. Since the prepackaged mold compound pieces 73 are self packaged, storage and shipping packing materials may be inexpensive and no additional protective layers are needed. The protection of the mold compound from moisture prevents many of the package cracking problems and voids associated with moisture contaminated mold compound. The top 74 may be opaque and may carry labeling information in text and machine readable forms, such as bar codes or so called UPC labels. This labeling on the mold compound package 71 provides an easy mechanism for checking that the correct type of mold compound is being used for a particular packaging operation. Also, the packaging affords the opportunity to use alternative mold compounds because the mold plunger and mold receptacle or pot are not in direct contact with the compound.

A critical element to the operation of the molding process using the prepackaged molding compound is the packaging material. The requirements for the packaging of the mold compound have been established for an integrated circuit assembly process using industrial standard requirements for molding compounds and for the resulting integrated circuit packages. The package should not create residue or glue like substances in the mold during molding. The mold compound packaging should not contaminate the mold runners or receptacle. The material used in the packaging should not add to ionic contamination of the resulting packages, that is the material should not have an ionic content higher than that of the molding compounds in use in the integrated circuit packaging art. The material should not melt during the molding process, so it should have a melting temperature at least ten degrees Celsius greater than the molding temperatures. Typically, the material needs to have a melting point greater than 200 degrees Celsius.

Also, the packaging material should only allow the molding compound to exit the package at selected points adjacent to the runners, and it should not open prematurely during the preheat phase of the molding operation. So the seals should not open and emit molding compound prematurely. However, once the edge seals are permeable the mold compound should flow out of the package with a minimum of resistance to flow. The material should not tear in normal handling or shipping, but should have the capacity to stretch into the runners when compressed during the molding process as described above. The material should be capable of vacuum sealing and of maintaining the vacuum during storage.

Materials which meet these requirements, and are also economical in use, can be used to wrap the mold compound as shown in FIG. 7. Possible materials include polymer films, elastomers, synthetic rubber, foils and metal films, and the like. Although many materials may exist that could meet these requirements, it is now known that certain plastic films meet the requirements listed above. Plastic films such as those used in food storage, freezing and preparation, are particularly well suited to this application. The melting point, strength, vacuum capability and moisture and air barrier requirements for the mold compound packaging are all met by such films. The films are inexpensive and easy to purchase and use in a production environment. One preferred film is MYLAR™ polyester film, such as for example MYLAR™ 40 XM 963-AT, a polyester film for packaging available from DuPont, DuPont de Nemours Int. S.A., Geneva, Switzerland; or DuPont (U.K) Ltd, Maylands Avenue, GB-Hemel Hempstead, England. Another preferred film is ICI™ polyester film. Similar films are commercially available from a variety of vendors.

Once the appropriate material is selected, the film should be applied to the mold compound to create the necessary packaged mold compound insert. The mold compound can be packaged in solid or liquid form. The package can be made a variety of ways, but one process that has been shown to be advantageous is as follows. An extruded piece of mold compound is placed over the bottom piece of film. The bottom piece is wider and longer than the mold compound. Top piece 74 is placed over the bottom piece of film. Top piece 74 is also longer and wider than the bottom piece. Heating blocks or other sealing means can be applied to those areas where the film exceeds the size of the mold compound 73. After the seal is formed, the top 74 is cut outside of the seals to form the package as shown in FIG. 7. The size of this lip is again determined by the mold design. If other support means is provided, this lip is not required at all. The lip can then be eliminated altogether.

Alternative packages include seamless envelopes that are filled from one end, tubes, straws, rounds, discs, etc. The key points are that the package be made such that in normal use the mold compound is protected and a vacuum is maintained, and that the molding can be done with the package still on the mold compound, that is the mold compound is automatically dispensed from the package.

The key feature of the package 71 of FIG. 7 is that there is no need for a nozzle, top or sprout. The mold compound is packaged such that it will leave the package under compression during the molding process. As will be shown below, the mold compound will automatically exit the package at the runners, so no alignment or precise positioning of the sproutless mold compound package is required.

Alternative means of packaging the mold compound are feasible. A tube of the plastic packaging material of the preferred embodiment can be sealed at one end and filled with a piece of extrusion, solid or liquid molding compound. The tube can be plastic film as described above, or any alternative material which meets the requirements for the packaging materials.

Preferably, the package 71 is sealed in the final stages under a vacuum. This may be accomplished, for example, by sealing the edges 77 and one end 76, then moving the partially sealed package 71 to a vacuum chamber where the seals can be completed. The advantage of vacuum sealing is that it eliminates voids caused by air trapped in the package. If air is allowed to be packaged with the mold compound, as the mold compound is pushed out of the package the air will also be pushed out of the package and into the die cavities, where voids can be formed as a result. Also, moisture is removed under the vacuum. Moisture contamination in molding compound leads to package cracking and early device failure.

Whatever means is used to package the mold compound, the sealing mechanism should be provided such that under pressure, or heat and pressure, the sealed package will allow the mold compound to escape. However, under normal handling, the package should be impervious to air, water, ionic contamination, and should not burst or leak out the packaged molding compound.

FIG. 8 depicts a portion of a bottom mold 82, comprising a mold chase 81 for transfer molding integrated circuit packages, such as for example DIP or flat quad type high pin count integrated circuit packages, using the mold compound package of FIG. 7. Bottom mold 81 holds two cavity bars 83, each of which has several die cavities 85 coupled to primary runners 87 and each cavity having a gate 89. A rectangular mold compound receptacle 91 is provided through the mold chase 81. This receptacle 91 is open at the bottom for allowing a plunger or ram to enter the mold chase and to apply pressure to a prepackaged mold compound insert resting at the top of receptacle 91, to force the mold compound into the runners and the cavities. A typical mold system would include two to four of these mold chase pairs 83, so it would have two to four receptacles 91, and cavities along both sides of each receptacle. In some cases, more chases can be used, such as 6 or 8 chases in a single mold. The number of chases depends on the mold press.

Figure 9:
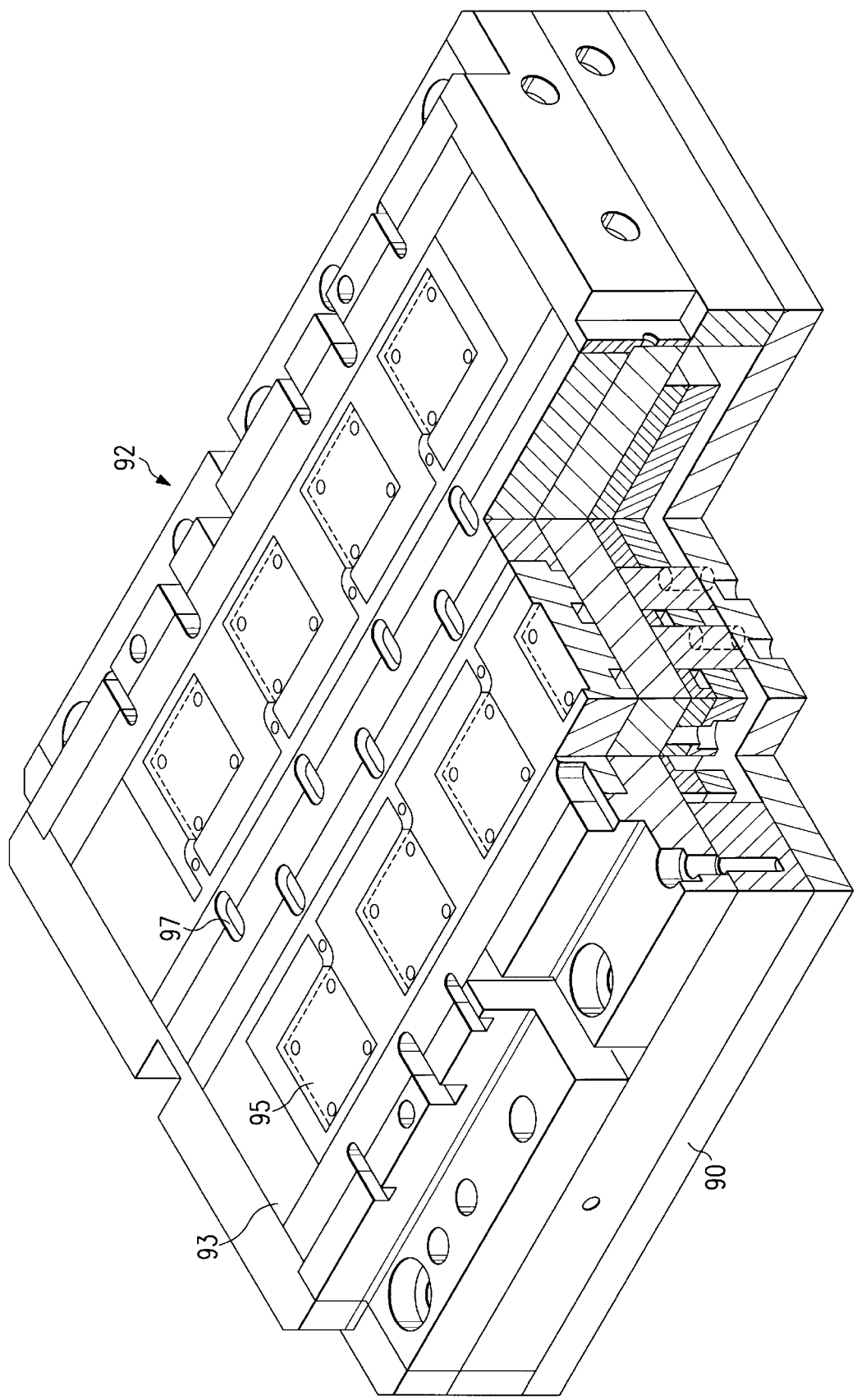
FIG. 9 depicts a top mold and chase of the mold system of the invention.

FIG. 9 depicts a portion of a top mold 92 for use with the bottom mold of FIG. 8 and the prepackaged mold compound of FIG. 7. In FIG. 9, top mold chase 91 carries top mold cavity bars 93, each of which is provided with a row of cavities 95 which are positioned to be placed over the bottom mold chase cavities 87. Delivery runners 97 are positioned with an outer end which will meet an associated primary runner 87 in the bottom mold chase, and an inner end which will lie over the receptacle 91.

Figure 10:
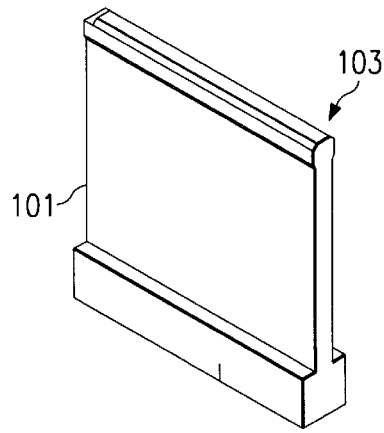
FIG. 10 depicts the plunger used with the top and bottom mold and the prepackaged mold compound of the invention.

FIG. 10 depicts the plunger 101 which is used with the top mold 92 of FIG. 9 and the bottom mold 82 of FIG. 8. The top of plunger 101 is sized so as to fit within the receptacle 91 in the bottom mold 82. The top of the plunger will compress the plastic mold compound package 71 against the top mold chase 92 in an even manner along the mold compound package. The top of plunger 101 is machined and beveled to form a tip 103. Tip 103 has two slots at the sides so that a small area at the edge of the top and sides are spaced beneath the top surface a short distance. This area will compress against the sides of the plastic package 71. As the plastic package 71 is compressed with the plunger 101, the plastic can deform into this spacing and compress further without holding the top surface of the plunger away from the top mold surface.

Figure 11:
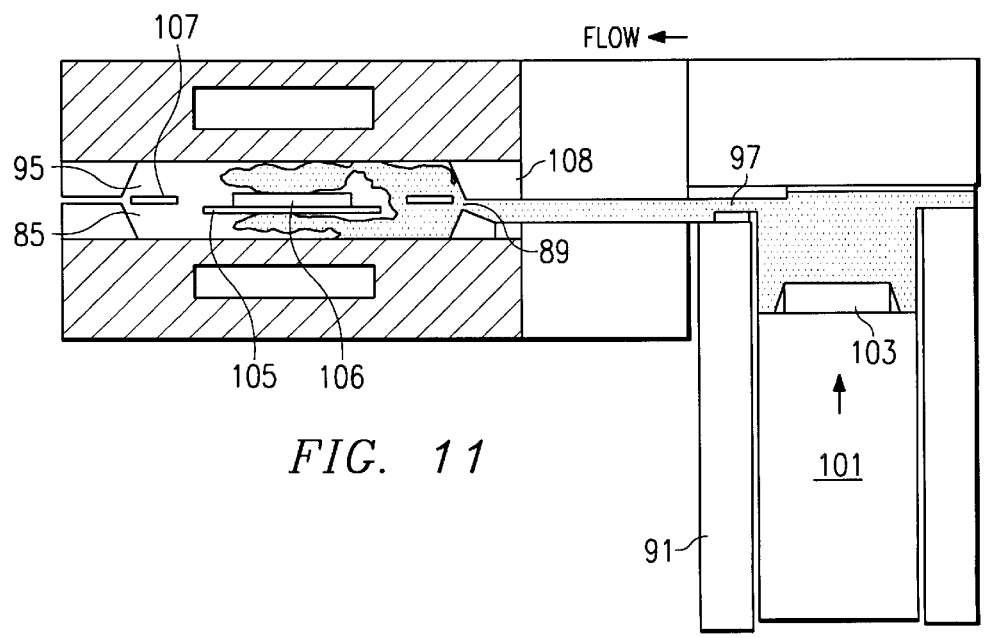
FIG. 11 depicts the plunger, prepackaged mold compound and mold cavity in cross section during the transfer stage of the molding process.

FIG. 11 depicts a cross-sectional view of a die 106, die pad 105 and leadframe 107 assembly located in a cavity of the mold during the transfer stage, and the operation of the mold compound and plunger. The cavity is formed by the top and bottom mold chase cavities 95 and 85. Also shown is the mold compound package 71, and the plunger 101 and tip 103, all in cross section during the transfer operation.

In operation, the prepackaged molding system including the mold compound package shown in FIG. 7, the bottom mold chase of FIG. 8, the top mold chase of FIG. 9, and the plunger of FIG. 10, operates as follows. The mold is opened so that the top mold and top mold chase is separated from the bottom mold and bottom chase and the bottom mold cavity rows 83 may be accessed from above. Lead frame and die assemblies are placed over the bottom mold chases 81 such that a single leadframe and die with its bond wires is centered over each cavity 85. A mold compound insert 71 is placed in each receptacle 91 in the bottom mold. These placements are preferably performed by an automatic pick and place mechanism, as is known in the prior art, but alternatively may be performed manually. The mold compound inserts are preferably loaded substantially simultaneously across the mold, or almost so, so that the total amount of time they are heated is similar. This prevents premature curing of the first loaded inserts.

The bottom and top molds may be heated as in the conventional transfer molding stations, and the heat in the mold itself is sufficient to transition the mold compound 73 into the transfer phase without preheating, so the preheating step required with the prior art single pot molding press is eliminated.

After the bottom mold chases are loaded and the molding compound packages are in place in the bottom mold receptacles, the mold is closed and the top mold chases are brought into contact with the leadframe and die assemblies and the mold compound packages. Delivery runners 97 in the top mold cavity bars 93 are now positioned so that the inside ends of these runners are over the top edges of the mold compound packages.

The mold compound may be heated for a short time to reach the low viscosity state. When molding smaller packages, this heating is not required as the heat already in the mold will rapidly make the low volume of mold compound in the insert transition to the low viscosity state. When the mold is closed, if the mold compound package is heat sealed as described above, the seal in edges 77 of the molding compound packages opens, that is, the heat relaxes the seal so it is penetrable. This relaxing of the seal should occur after the mold is closed, and should be fairly complete. If a sealing method other than a heat seal is used, it should provide a seal that opens in response to either heat, pressure, or both. The mold is typically heated to a temperature of 175 degrees Celsius when resin or resin filler molding compound is used in either powdered solid or liquid states.

After the heat seals are relaxed and the mold compound enters the low viscosity state, the plunger 101 of FIG. 10 is applied. In a preferred embodiment, the plunger travels 101 through the bottom mold platen and into the bottom mold receptacles 91, compressing the mold compound packages from underneath. Alternatively, the mold compound could be compressed from above, with the receptacles formed in the top mold platen. In this case, the insert would be loaded with the top plastic layer 74 down, that is, adjacent to the bottom mold chases. Either arrangement will work to transfer the mold compound into the primary runners. If the material used for the package is not heat sealed, the pressure will cause the material to burst and open in the only places where the mold compound can escape, that is, where the runners meet the receptacle. In other areas the mold compound is compressed against the receptacle walls and cannot escape, so the package is not burst open at those places.

The sproutless mold compound package is compressed by the action of the plunger and as it is compressed the mold compound package will begin to push at the edges of the receptacle 91. As the only exits available to the mold compound are the runners 97 in the top mold cavity bars 93, the compound will pass through the now penetrable heat seal at the edge of the plastic package 71 and into the primary runners 97. The delivery runners each feed a primary runner 87 in the bottom mold cavity bars 83. A circular coupling area at the inner end of the primary runners meets the outer end of the delivery runners 97, and the mold compound is transferred to the secondary runners 87. The mold compound then enters the cavities 85 over the gates 89, and begins filling the individual package cavities 85. Alternative mold designs could compress the compound insert with mechanisms other than plungers, such as compressed air, liquid, rams, screws, etc., and still obtain all the advantages of the use of the invention.

The advantage of the sproutless mold compound packaging and mold design of the invention is now apparent. The mold compound is delivered to the mold runners from the prepackaged packaging without sprouts or nozzles or bulges. No cutting or opening means is required to direct or force the mold compound out of the packaging. The packaging and mold system has all the advantages of the sprouted bags of the prior art, but additionally is simpler for loading and molding. Also, the mold compound inserts can be made in universal sizes, since the mold compound is automatically delivered to the runners in the correct places, no alignment or precise loading equipment is needed, and a single size and shaped mold compound insert of the invention can be used with many different mold designs without modification.

The sproutless mold compound insert of the invention provides many advantages in addition to the ones mentioned above in enabling flexible mold design. The mold cavities of FIGS. 8 and 9 depict runners intersecting the mold receptacle from a perpendicular direction. Alternatively, the ends of the mold receptacle could also supply runners from the sproutless package. The sproutless package could be made rectangular, round, oval, or serpentine as required by a particular mold design. The width to length aspect ratio of the compound packaged is totally flexible. The cross section is also widely adaptable. Additionally, the seam that is used to seal the mold compound insert can be minimized or reduced to nearly zero width, and if a seamless tube is provided it can be eliminated; depending on the materials and sealing process chosen.

FIG. 11 shows a cross sectional view of the transfer stage of the molding process. The operation of tip 103 can be seen, as the plastic package sides are compressed into the slots machined into the plunger 101 so that the compression can continue without interference. The compound travels into the delivery runner 97, then into the primary runner 87, over the gate 89, and into the cavity 108 formed by the top and bottom chase cavities 95 and 85.

After the cavities are filled with the compound, the molding process continues as a conventional transfer molding process. A curing time may be required to complete the packages. After the packages are cured, the top mold is moved away from the bottom mold. Small release plungers, not shown, are activated to push upwards and release the packaged devices from the cavities 85, and the sprue or flash is released from the runners 87. The mold compound package 71 is now empty and resting in the receptacle 91, and it too is removed. The need to clean the receptacle 91 and the plunger 101 is greatly reduced because the packaging of the invention serves to isolate the plunger and the receptacle from the mold compound.

The plungers 101 are easily controlled with a variable rate of compression to achieve a tight process control parameter during the transfer phase. This leads to uniform fill of the cavities, which are evenly spaced and equidistant from the source of the mold compound, and the transfer speed can be controlled to eliminate voids while minimizing pad tilt and wire sweep defects. The transfer speed and transfer pressure can be controlled by fitting an independent process controller circuit to the mold system to allow multi-step, variable speed and variable pressure capability. This equipment can be retrofitted to an existing mold press.

An advantage of the prepackaged sproutless mold system of the invention is that is provides balanced fill capability. It can be seen that each primary runner 97 and secondary runner 87 is the same length. Also, because the cavities are all equidistant from the source of the mold compound, receptacle 91, the problems of nonuniform fill and wire sweep associated with the single pot mold systems of the prior art are eliminated using the molding system of the invention. The design allows balanced cavity filling to be achieved.

Further, because the mold compound is prepackaged in a protective package, the mold receptacle 91, the plunger 101, and to some extent the primary runners 97 are protected from the abrasive mold compound, so that the wear rate is greatly reduced. This results in longer mold life and reduced repair and replacement costs over the life of the mold surfaces, thus lowering the unit cost.

It can further be seen that as another advantage of the use of the invention, the mold receptacle 91 takes a small amount of area compared to the large single pot and primary runners of the single pot transfer molds of the prior art. This is an advantage in that additional space is available for cavities and additional units may be molded during each run. The density for the system is improved over the prior art.

The mold design and mold compound package is also compatible with existing autoloading systems for transfer molds, so that the prepackaged molding system may be retrofitted into an existing automated transfer mold assembly line for a reasonable cost. The plunger design and mold design results in a need for two to four plungers per mold, which is cheaper to build and maintain than the multiple plungers needed for a mini-pellet multiple plunger system.

Further advantages are that the mold compound packages are reasonable in cost and may be produced in volume for a lower price per kilogram than the mini-pellets required by the prior art or the multiple packets required by the sprouted bag encapsulation system. It is believed that as the volume increases the prepackaged mold compound inserts of the invention may be produced at a price similar to the pellets of the single pot molding systems of the prior art.

Because the throughput rate of the prepackaged insert mold system is high, the number of stations required for a particular throughput rate is lower than the multiple plunger stations used with either the mini-pellet of the sprouted bag encapsulation systems of the prior art. Accordingly, the capital costs required to achieve a particular productivity level are less than either of these approaches.

Another advantage is that the mold compound system of the invention provides an efficient use of the molding compound. The runners are short from the receptacle 91 to the cavities 85. The amount of mold compound left in the pencil package can be minimized by careful design of the plunger so that almost all of the compound is transferred from the plastic package to the runners. The amount of sprue or flash left in the runners is far less than a single pot transfer mold and somewhat less than the mold compound waste resulting from a multiple pot multiplunger system.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for encapsulating integrated circuit devices, comprising:

a top mold platen supporting at least one top mold chase;

a plurality of top die cavities within said at least one top mold chase;

a bottom mold platen supporting at least one bottom mold chase, said top and bottom mold chases being engageable with one another;

a plurality of bottom die cavities within said at least one bottom mold chase, each corresponding to one of said top die cavities;

a plurality of integrated circuit die and leadframe assemblies positioned within said top and bottom die cavities such that each die is centered over one of said bottom die cavities and covered by a space defined by the corresponding one of said top die cavities;

at least one mold receptacle containing a sproutless mold compound insert, said sproutless mold compound insert comprising a quantity of mold compound packaged in a plastic film that has a heat seal, said heat seal becoming flexible when heated in said mold receptacle;

runners coupling said at least one mold receptacle to said bottom die cavities, said runners being of approximately equal lengths;

gates positioned between said bottom die cavities and said runners;

at least one plunger associated with said at least one mold receptacle for applying pressure to said sproutless mold compound insert within said receptacle, said sproutless mold compound insert bursting along said heat seal in response to said pressure and mold compound within said sproutless mold compound insert being pushed into said runners and eventually filling said die cavities with mold compound, such that said integrated circuits die and leadframe assemblies are encapsulated in mold compound responsive to pressure applied by said at least one plunger.

2. The apparatus of claim 1 wherein said sproutless mold compound insert comprises a thermoset resin mold compound in a package.

3. The apparatus of claim 1 wherein said sproutless mold compound insert comprises a thermoset resin packaged in a plastic film.

4. The apparatus of claim 3 wherein said sproutless mold compound insert comprises a thermoset resin packaged in a plastic film that is heat sealed at the edges.

5. The apparatus of claim 1, wherein said bottom die cavities are coupled to said runners by gate regions which restrict the flow of said mold compound into said cavities such that the fill rate of said cavities with said mold compound is a predetermined rate.

* * * * *